(12) United States Patent
Yehezkely et al.

(10) Patent No.: US 11,303,158 B2
(45) Date of Patent: Apr. 12, 2022

(54) HIGH SENSITIVITY ENERGY HARVESTER

(71) Applicant: Wiliot, Ltd., Caesarea (IL)

(72) Inventors: Alon Yehezkely, Haifa (IL); Ido Yogev, Pardes-Hana Karkur (IL)

(73) Assignee: Wiliot, Ltd., Caesarea (IL)

( * ) Notice: Subject to any disclaimer, the term of this patent is extended or adjusted under 35 U.S.C. 154(b) by 0 days.

(21) Appl. No.: 16/876,715

(22) Filed: May 18, 2020

(65) Prior Publication Data
US 2020/0350785 A1 Nov. 5, 2020

Related U.S. Application Data

(63) Continuation of application No. 16/176,460, filed on Oct. 31, 2018, now Pat. No. 10,658,875.

(60) Provisional application No. 62/579,570, filed on Oct. 31, 2017.

(51) Int. Cl.
*H02J 50/20* (2016.01)
*G01R 19/165* (2006.01)
*H02J 50/80* (2016.01)

(52) U.S. Cl.
CPC ........ *H02J 50/20* (2016.02); *G01R 19/16595* (2013.01); *H02J 50/80* (2016.02)

(58) Field of Classification Search
CPC ...... H02J 50/20; H02J 50/80; G01R 19/16595
USPC ........................................................ 307/104
See application file for complete search history.

(56) References Cited

U.S. PATENT DOCUMENTS

| | | | |
|---|---|---|---|
| 10,205,084 B2 | 2/2019 | Vaidya et al. | |
| 10,238,872 B2 | 3/2019 | Pivonka et al. | |
| 2006/0281435 A1 | 12/2006 | Shearer et al. | |
| 2013/0257219 A1 | 10/2013 | Monfray et al. | |
| 2015/0236551 A1 | 8/2015 | Shearer et al. | |
| 2015/0256097 A1 | 9/2015 | Gudan et al. | |
| 2015/0324681 A1* | 11/2015 | Mats ................ | G06K 19/07754 235/492 |
| 2016/0049823 A1 | 2/2016 | Stein et al. | |
| 2017/0046933 A1 | 2/2017 | Stewart et al. | |
| 2017/0279276 A1 | 9/2017 | Amin et al. | |
| 2018/0139698 A1 | 5/2018 | Quinlan et al. | |
| 2018/0152091 A1 | 5/2018 | Donnelly et al. | |
| 2018/0183274 A1 | 6/2018 | Auten et al. | |
| 2018/0283913 A1 | 10/2018 | Chen et al. | |
| 2019/0013690 A1 | 1/2019 | Chen et al. | |
| 2019/0252924 A1 | 8/2019 | Bito et al. | |

OTHER PUBLICATIONS

Kang, et al., Bootstrapped Rectifier-Antenna Co-Integration for Increased Sensitivity in Wirelessly-Powered Sensors, 2018, IEEE, pp. 1-11.

(Continued)

*Primary Examiner* — Michael R. Fin
(74) *Attorney, Agent, or Firm* — M&B IP Analysts, LLC

(57) ABSTRACT

A power management circuit is provided. The power management circuit includes a plurality of detectors, wherein each of the plurality of detectors are configured with a different reference threshold voltage level; and a controller coupled to the plurality of detectors and configured to activate a subset of the plurality of detectors at any given time, wherein a subset of the plurality of detectors, when activated, are configured to provide a multi-level voltage level indication on a state of a voltage supply.

19 Claims, 4 Drawing Sheets

(56) References Cited

OTHER PUBLICATIONS

Lee, et al., A 635pW Battery Voltage Supervisory Circuit for Miniature Sensor Nodes, University of Michigan, Ann Arbor, MI., 2012, IEEE, pp. 202-203.
The International Search Report and The Written Opinion for PCT/US2019/058281 of the International Searching Authority, dated Feb. 6, 2020, ISA/RU, Moscow, Russia.

* cited by examiner

HIGH SENSITIVITY ENERGY HARVESTER

CROSS REFERENCE TO RELATED APPLICATIONS

This application is a continuation application of U.S. patent application Ser. No. 16/176,460 filed on Oct. 31, 2018, which claims the benefit of U.S. Provisional Application No. 62/579,570 filed on Oct. 31, 2017, the contents of which are hereby incorporated by reference.

TECHNICAL FIELD

The present disclosure generally relates to wireless Internet of things (IoT) devices, and more particularly to power harvesting devices.

BACKGROUND

The Internet of things (IoT) is the inter-networking of physical devices, vehicles, buildings, and other items embedded with electronics, software, sensors, actuators, and network connectivity that enable these objects to collect and exchange data. IoT is expected to offer advanced connectivity of devices, systems, and services that goes beyond machine-to-machine (M2M) communications and covers a variety of protocols, domains, and applications.

IoT can be encapsulated in a wide variety of devices, such as heart monitoring implants; biochip transponders on farm animals; automobiles with built-in sensors; automation of lighting, heating, ventilation, air conditioning (HVAC) systems; and appliances such as washer/dryers, robotic vacuums, air purifiers, ovens or refrigerators/freezers that use Wi-Fi for remote monitoring. Typically, IoT devices encapsulate wireless sensors or a network of such sensors.

Most IoT devices are wireless devices that collect data and transmit such data to a central controller. There are a few requirements to be met to allow widespread deployment of IoT devices. Such requirements include reliable communication links, low energy consumption, and low maintenance costs.

To this aim, IoT devices and wireless sensors are designed to support low power communication protocols, such as Bluetooth low energy (BLE), LoRa, and the like. However, IoT devices utilizing such protocols require a battery, e.g., a coin battery. The reliance on a power source (e.g., a battery) is a limiting factor for electronic devices, due to, for example, cost, size, lack of durability to environmental effects, and frequent replacements.

An alternative to using batteries is power supply which may be harvested from sources such as light, movement, and electromagnetic power such as existing radio frequency transmissions. The harvested power is stored in a capacitor or a rechargeable battery, and typically managed by a power management unit (PMU). A PMU is a circuit block that performs general circuit power related operations, such as supply regulation, voltage and current references, power on indication, brown-out indication, power modes control, management of power storage units, and more.

Specifically, in power harvesting systems, a PMU provides energy storage and voltage threshold crossing indications based on measurement of the voltage over the storage capacitors. Commercially available power harvesting solutions are typically implemented in radio-frequency identification (RFID) and based on a Schmitt trigger.

FIG. 1 shows a diagram of a conventional RFID tag 100 based on a harvester 110. The harvester 110 is coupled to a PMU 120 including a Schmitt trigger 122. The harvester 110 receives RF signals transmitted by a RFID reader (not shown). The energy of the received RF, signals and charges a capacitor 112, where the conversion of energy to current is performed by means of a voltage multiplier 114. A voltage multiplier is an electrical circuit that converts AC electrical power to a DC voltage and cascades its DC outputs to multiply the output voltage level, typically using a network of capacitors and diodes. An example for such a multiplier is a Dickson multiplier.

The PMU 120 determines when the voltage level at the capacitor 112 is sufficient so that the RFID tag 100 can respond to the RFID reader. To this end, a reference voltage threshold (Vref) is compared to the voltage level (Vin) at the capacitor 112. Once the voltage level Vin is over the threshold 121, the Schmitt trigger 122 switches from zero to one, signaling that the RFID tag 110 device can respond to the RFID reader. The response is typically a sequence of predefined bits. In the conventional prior art solutions, the PMU 120 is always based on a single threshold (Vref) and a non-stringent power requirement.

A Schmitt trigger 122 is a comparator circuit with a hysteresis 124 implemented by applying positive feedback to the noninverting input of a comparator or differential amplifier. A Schmitt trigger is an active circuit which converts an analog input signal to a digital output signal. As such, power is required to operate the Schmitt trigger 122. The power is provided by the harvester 110.

Typically, RFID tags provide simple, low power consuming, processing and computing capabilities. Their operations are based on very strong (up to 4 Watts) signals transmitted from RFID readers over the air. The input sensitivity (e.g., lowest operation power received over the air) is about −15 dBm.

The harvester 110 implemented in RFID tags cannot be efficiently utilized to power other low-power communication devices (e.g., BLE devices). The reason is that the BLE protocol is not designed to transmit strong RF signals by external sources. Further, any existing commercial BLE consumes power in a way that RF harvesting is not possible, as the BLE standard has not been designed for battery-powered devices. An attempt to design a harvester based on parasitic RF signals in the air would require a high sensitive harvester, loaded by extremely low power devices. That is: a harvester that operates on very low power RF signals. Further, the power consumption by the harvester and the PMU should be minimized, so that the harvested power would not be completely utilized to power the harvester and the PMU.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a power management circuit comprising a plurality of detectors, wherein each of the plurality of detectors are configured with a different reference threshold voltage level; and a controller coupled to the plurality of detectors and configured to activate a subset of the plurality of detectors at any given time, wherein a subset of the plurality of detectors, when activated, are configured to provide a multi-level voltage level indication on a state of a voltage supply.

Certain embodiments disclosed herein include a harvester circuit comprising a voltage multiplier coupled to an antenna and configured to harvest energy from over-the-air signals; an energy storage coupled to the voltage multiplier and a wireless chip, wherein the energy storage provides a voltage supply to the wireless chip; a power management circuit including a detection circuitry and a controller, wherein the power management circuit provides, the wireless chip, a multi-level voltage level indication on a state of a voltage supply.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
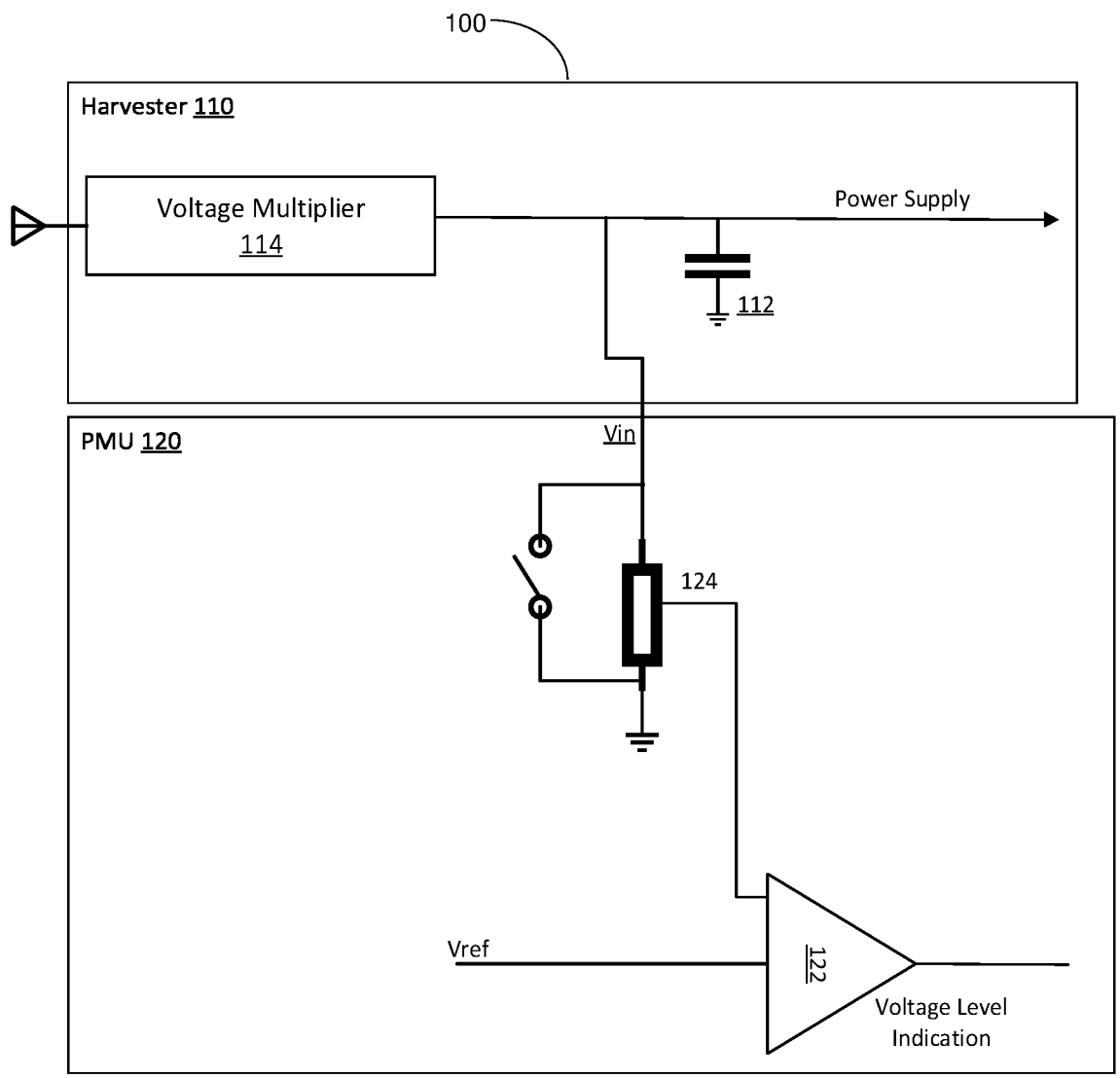
FIG. 1 is a diagram of a conventional RFID tag based on a harvester.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, "like numerals" refer to "like parts" through several views.

The example embodiments disclosed herein include an efficient, high sensitive, harvester designed with a multi-level power detection-based PMU. The harvester can be operable to power wireless IoT chips communicating using low power communication protocols, such as BLE protocols. To this end, the disclosed harvester is designed to power an IoT chip operable at different voltage levels while maintaining low loading DC dissipations. The dissipation factor is based on the efficiency of the voltage level detectors. According to the disclosed embodiments, multiple voltage level comparators are utilized to provide multiple voltage level indications.

Figure 2:
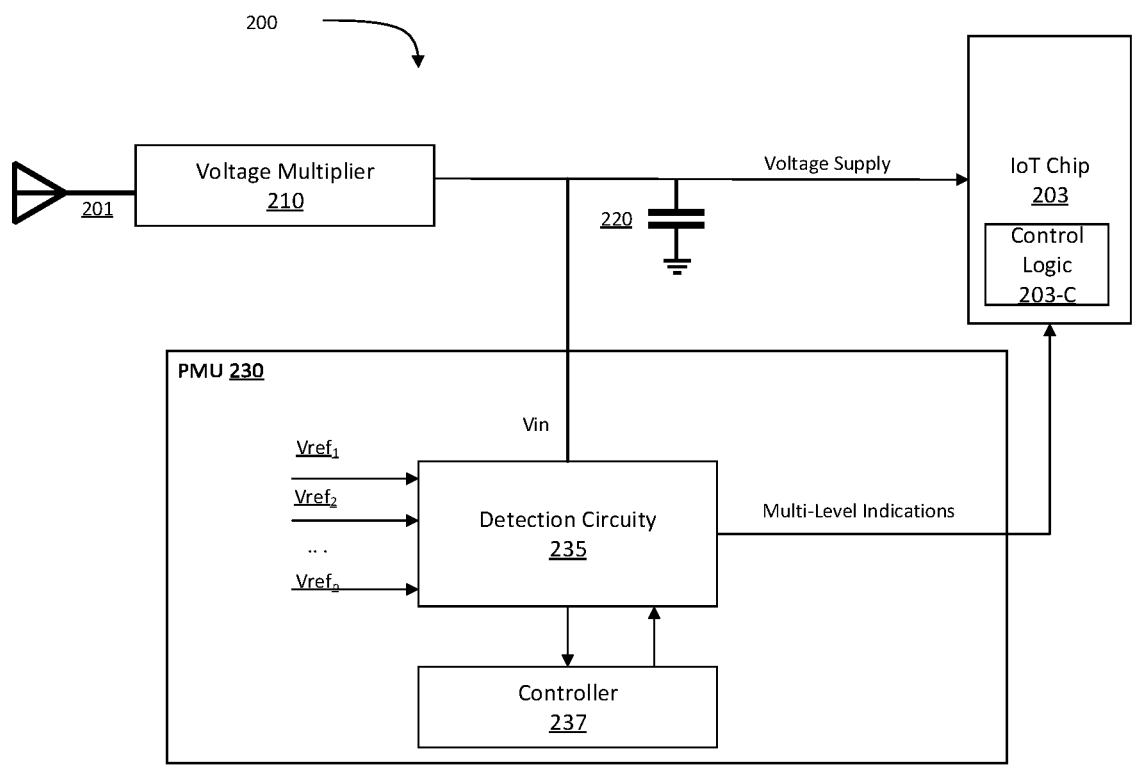
FIG. 2 is a block diagram of a harvester circuitry designed according to an embodiment.

FIG. 2 shows an example block diagram of a harvester circuitry 200 designed according to an embodiment. The harvester circuitry 200 is coupled to an antenna 201 and a wireless IoT chip 202. The harvester circuitry 200 serves as the power source of the wireless IoT chip 203. The chip 203 is designed to communicate using a low power communication protocol. Examples for such a protocol includes, but is not limited to, Bluetooth Low energy (BLE), Bluetooth®, LoRa, Wi-Gi®, nRF, DECT®, Zigbee®, Z-Wave, EnOcean, and the like.

The wireless IoT chip 230 operates at different modes (e.g., scan, sleep, receive, transmit, etc.), each such mode requiring a different voltage level to power the various logic and RF components (not shown) of the wireless IoT chip 203. To this end, the harvester circuitry 200 is configured to provide multiple voltage levels to the wireless IoT chip 203, while maintaining a low loading DC dissipation value.

The antenna 201 may be implemented as a receive/transmit antenna of the wireless IoT chip 203. That is, in such a configuration, the antenna 201 is primarily designed to receive/transmit wireless signals according to the respective communication protocol of the wireless IoT chip 203 (e.g., 2.400-2.4835 GHz signal for BLE). In another embodiment, the antenna 201 may be designed solely for the energy harvesting, and operates in a different frequency band, direction, or both, then those defined in the standard of the respective communication protocol. It should be noted that, in both configurations, energy can be harvested from any wireless signals received in the air.

The harvester circuitry 200 includes a voltage multiplier 210 coupled to the antenna 201 and an energy storage 220. The circuitry 200 also includes a PMU 230 coupled to the energy storage 220. In an example embodiment, the voltage multiplier 210 is a Dickson multiplier, while the energy storage 220 is a capacitor. The PMU 230 is an electronic circuit.

According to the disclosed embodiments, the PMU 230 provides multi-level voltage level indications to the wireless IoT chip 203, and in particular to a control logic 203-C of the chip 203. These indications allow the control logic 203-C to determine the state of a Voltage Supply at any given moment when the capacitor charges or discharges.

In an embodiment, the PMU 230 includes a detection circuitry 235 controlled by a controller 237. Specifically, in an embodiment, the detection circuitry 235 includes different voltage reference threshold detectors, where, at any given time, only a subset of such detectors are active to perform the detection. The sub-set of detectors to be activated at any given moment is determined by the controller 237.

Figure 3:
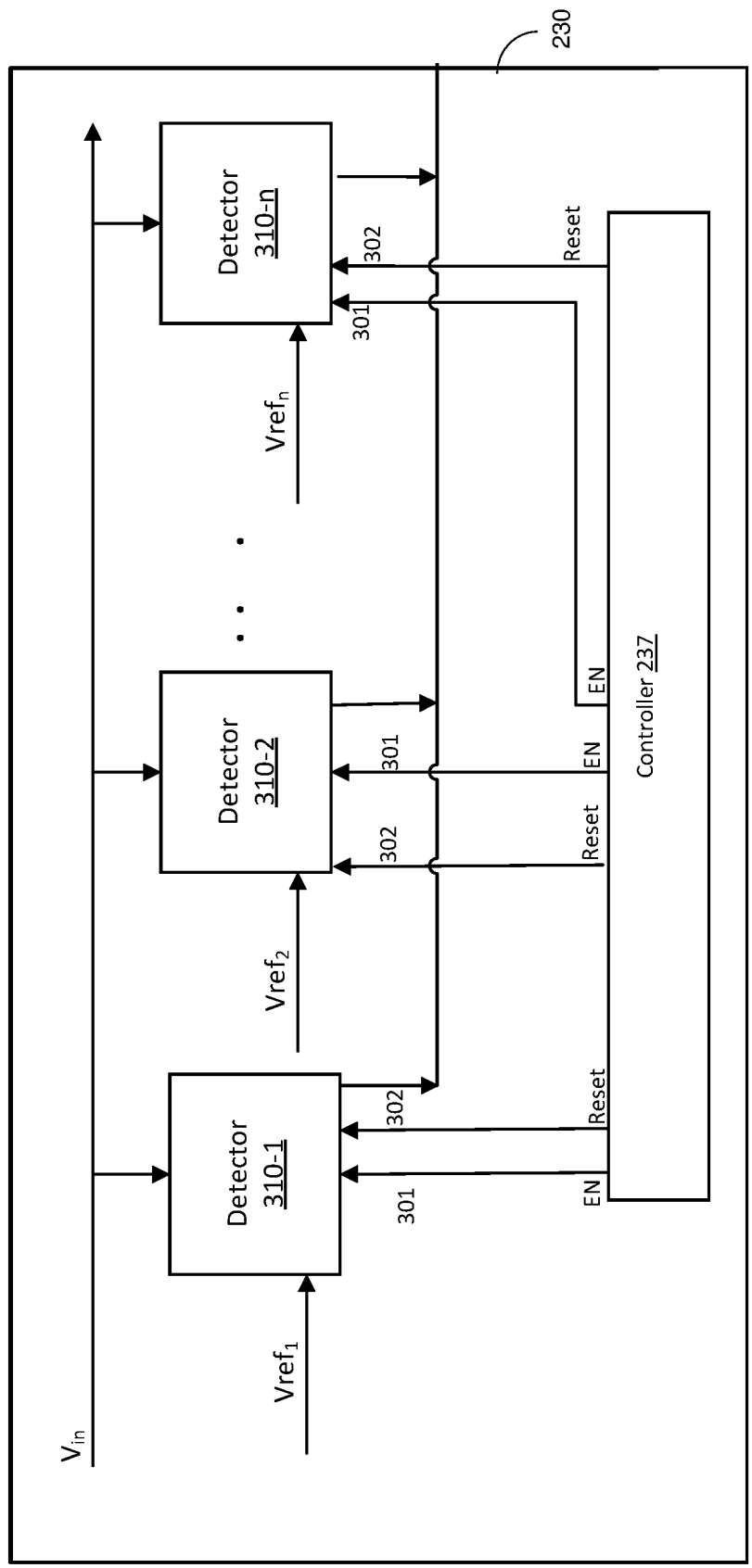
FIG. 3 is a block diagram of a harvester circuitry designed according to an embodiment.

FIG. 3 is an example block diagram of the PMU 230 according to an embodiment. The detection circuitry 235 includes a plurality of a detectors 310-1 through 310-n (where 'n' is an integer number greater than 1. The output of each detector 310 is connected to the controller 237 which generates control signals (302) respective thereof. The outputs of the detectors 310 are the voltage level indications which are provided to the control logic of 203-C of the IoT chip 203.

Figure 4:
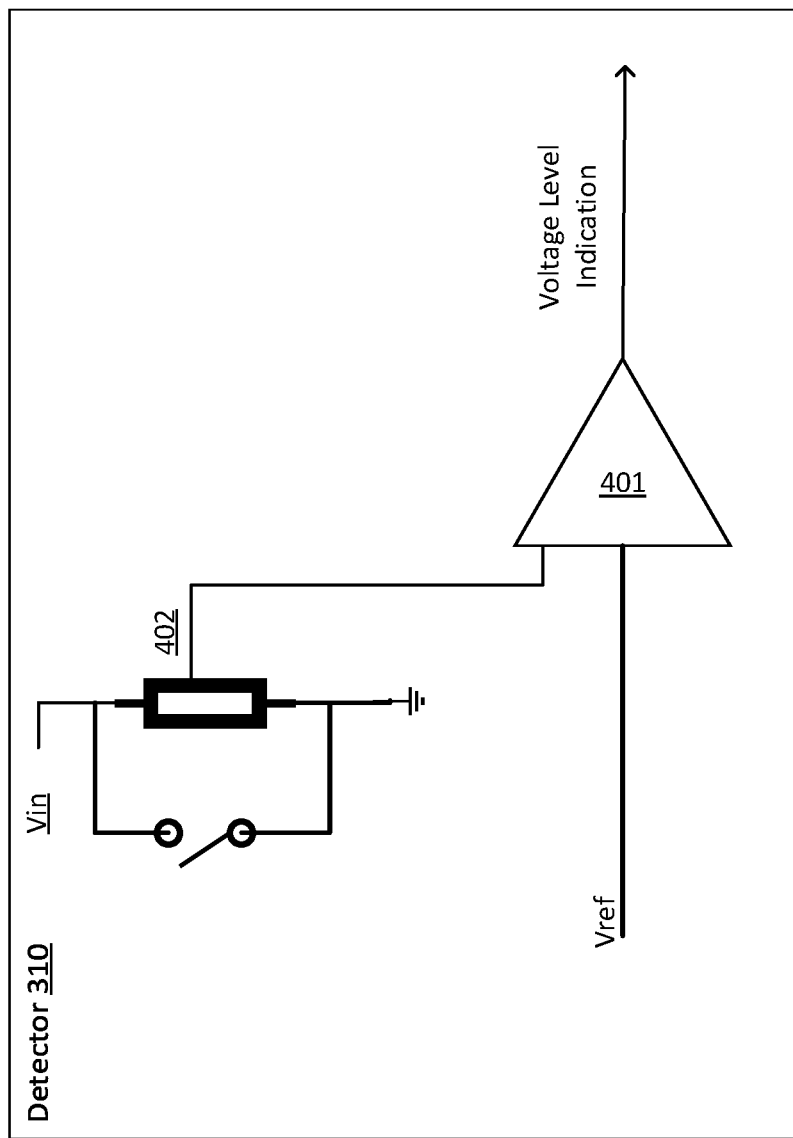
FIG. 4 illustrates a structure of a detector according to an embodiment.

In an embodiment, illustrated in FIG. 4, each detector 310 includes a Schmitt trigger 401 with a hysteresis 402 implemented as a comparator circuit. The comparison performed by the hysteresis 402 is between the voltage level (Vin) at the energy storage (energy storage 220, FIG. 2) and the reference voltage level (Vref). Each detector 310 is set with a different value of Vref. The Schmitt trigger 401 is an active circuit which converts an analog input signal to a digital output signal, being a voltage level indication relative to the Vref. That is, a logical output '1' may indicate a crossing of the Vref, while a logical output '0' does not. As noted above, a Schmitt trigger consumes power required for its operation. As a typical arrangement of the harvester circuitry 200 includes multiple detectors 310, the disclosed embodiments allow for minimizing their individual and, therefore, collective, power consumption.

Returning to FIG. 3, enable signals (collectively labeled as 301) output by the controller 237 activates or deactivates (i.e., turning on/off) each of the detectors 310. Specifically, each detector 310 is individually controlled by the controller 237 so that not all of the detectors 310 will always be on. To this end, based on the state of the voltage detection level (Vrefs), the controller 237 determines which of the detectors 310 should be "on", and which should be "off". This is performed to minimize the power consumed by the detectors 310. That is, a detector 310 that is not operable does not consume any power.

The controller 237 controls, enabler signals 301 and the detector signals 310 differently. As the voltage level raises, (the capacitor charges) and when the different voltage levels drop (the capacitor discharges). As Vin raises above a minimum detection level (e.g., 0.2V), all detectors 310 assigned to detect two levels below this level are turned to 'off' (by, e.g., disenabling, the respective enable signal(s) 301). In an embodiment, when Vin crosses $Vref_1$ of detector 310-1, the detector 310-2 turns 'on'; and the detector 310-1 remains 'on' until Vin crosses $Vref_2$ (of the detector 310-2). Generally, the detector 310-$i$ remains on until Vin crosses $Vref_{i+2}$ of a detector 310-$i$+2, wherein i=1, 2, . . . n).

The example Table 1 demonstrates the logic applied by the controller 237, according to an embodiment, when there are 4 detectors 310-1, 310-2, 310-3, and 310-4 for 4 voltage references $Vref_1$, $Vref_2$, $Vref_3$, and $Vref_4$, respectively.

TABLE 1

| | Vin > $Vref_i$ | Voltage Indication Level |
|---|---|---|
| $Vref_1$ | Detector 310-1 is on<br>Detectors 310-2, 310-3, 310-4 are off | $Vref_1$ |
| $Vref_2$ | Detectors 310-1, 310-2 are on<br>Detectors 310-3, 310-4 are off | $Vref_2$ |
| $Vref_3$ | Detectors 310-2, 310-3 are on<br>Detectors 310-1, 310-4 are off | $Vref_3$ |
| $Vref_4$ | Detectors 310-3, 310-4 are on<br>Detectors 310-1, 310-2 are off | $Vref_4$ |

In an embodiment, when the voltage level (Vin) drops, the control of the detectors 310 may be reversed to the logic applied when the Vin raises. In another embodiment, only certain detector(s) 310 remain active while the rest are turned. In that embodiment, the active detector(s) 310 are predetermined based on critical modes or functions of the wireless IoT chip (FIG. 2 230). In yet another embodiment, when the level of Vin starts to decrease, all detectors 310 are turned off except for one detector 310 with the lowest possible voltage reference.

The controller 237 is also configured to reset the detectors 310 using reset signals (collectively labeled as 302). The reset signals 302 are triggered when enabled ('on' state) for a period of time. Resetting the detectors 302 is required to reevaluate the comparator's "decision". For example, since there is a hysteresis, the trigger point when the input transitions from a low to high value is not the same as when the input transitions from a high to low value. Resetting the detectors 302 allows to determine if a high output bit would still be high when a new input signal transitions from a low to high transition. The reset signal is held until the comparator circuit is set to its initial reference threshold (Vref).

In an embodiment, the controller 237 can be realized as a circuitry of logical gates wired to perform the activation logic discussed above. In yet another embodiment, the controller 237 is realized as a microcontroller, a microprocessor, and the like, where the activation logic for activating the detectors 310 may be coded through software code executed by the controller 237. Software shall be construed broadly to mean any type of instructions, whether referred to as software, firmware, middleware, microcode, hardware description language, or otherwise. Instructions may include code (e.g., in source code format, binary code format, executable code format, or any other suitable format of code).

It should be noted that the wireless IoT chip discussed herein may include one or more sensors. Examples for such sensors include, but are not limited to, temperature, humidity, weight, oxygen, $CO_2$, pressure, location, bio-feedback, water, acoustic, light, and so on. In some configurations, the IoT chip may not include a sensor.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" or "at least one of A, B, and C" used in the description or the claims means "A or B or C or any combination of these elements." For example, this terminology may include A, or B, or C, or A and B, or A and C, or A and B and C, or 2A, or 2B, or 2C, and so on.

All examples and conditional language recited herein are intended for pedagogical purposes to aid the reader in understanding the principles of the disclosed embodiments and the concepts contributed by the inventor to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A power management circuit, comprising:
   a plurality of detectors, wherein each of the plurality of detectors is supplied with a unique, respective, and fixed reference threshold voltage level and each of the plurality of detectors, when activated, is configured to supply as an affirmative output an indication that a voltage of a voltage supply at least equals the respective reference threshold voltage level supplied thereto; and
   a controller coupled to the plurality of detectors and configured to activate a subset of the plurality of detectors at any given time, wherein the subset of detectors activated is changeable over time;
   wherein a subset of the plurality of detectors, when activated, provides a multi-level voltage level indication on a state of the voltage supply.

2. The power management circuit of claim 1, wherein the voltage supply is provided by a harvester circuitry.

3. The power management circuit of claim 1, wherein the multi-level voltage level indication is provided to a wireless chip.

4. The power management circuit of claim 1, wherein the controller is configured to individually control activation each of the plurality of detectors.

5. The power management circuit of claim 4, wherein the controller is configured to:
control each of the plurality of detectors based on a crossing of a reference threshold voltage level of another detector of the plurality of detectors.

6. The power management circuit of claim 5, wherein the control of a detector includes: enabling the detector and disabling the detector, wherein a disabled detector consumes no power.

7. The power management circuit of claim 4, wherein the controller is configured to:
control enablement of each of the plurality of detectors based on a current mode of operation of a wireless chip.

8. The power management circuit of claim 4, wherein the controller is configured to:
reset each of the plurality of detectors after enabling each of the respective detectors.

9. The power management circuit of claim 1, wherein the voltage supply is provided by a harvester circuitry that harvests wireless energy.

10. The power management circuit of claim 1, wherein each detector of the plurality of detectors includes:
a Schmitt trigger comprising a comparator circuit with a hysteresis, wherein the comparator circuit compares a voltage level at the voltage supply to the reference threshold voltage level supplied thereto.

11. A harvester circuit, comprising:
a voltage multiplier coupled to an antenna and configured to harvest energy from over-the-air signals;
an energy storage coupled to the voltage multiplier and a chip configured to be powered using only the harvested energy, wherein the energy storage supplies to the chip a voltage supply generated from the harvested energy;
a power management circuit including a detection circuitry and a controller, wherein the power management circuit provides to the chip a multi-level voltage level indication on a state of a voltage supply, wherein the detection circuitry further comprises:
a plurality of detectors, wherein each of the plurality of detectors employs a unique and fixed reference threshold voltage level.

12. The harvester circuit of claim 11, wherein the controller is configured to activate a subset of the plurality of detectors at any given time.

13. The harvester circuit of claim 11, wherein a subset of the plurality of detectors, when activated, are configured to provide the multi-level voltage level indication on a state of the voltage supply.

14. The harvester circuit of claim 11, wherein the controller is configured to individually control each of the plurality of detectors.

15. The harvester circuit of claim 11, wherein each detector of the plurality of detectors includes:
a Schmitt trigger comprising a comparator circuit with a hysteresis, wherein the comparator circuit compares a voltage level at the voltage supply to a respective unique reference threshold voltage level.

16. The harvester circuit of claim 11, wherein the chip employs at least one low power wireless communication protocol for communication.

17. An Internet of Things integrated circuit configured to be powered using only harvested energy, comprising:
an antenna;
a voltage multiplier coupled to the antenna and configured so as to harvest energy from over-the-air signals;
an energy storage coupled to the voltage multiplier wherein the energy storage supplies the IoT integrated circuit with a voltage supply generated from the harvested energy;
a plurality of detectors, wherein each of the plurality of detectors is supplied with a unique, respective, and fixed reference threshold voltage level and each of the plurality of detectors, when activated, is configured to supply as an affirmative output an indication that a voltage of the voltage supply at least equals the respective reference threshold voltage level supplied thereto; and
a controller coupled to the plurality of detectors and configured to activate a subset of the plurality of detectors at any given time, wherein the subset of detectors activated is changeable over time;
wherein a subset of the plurality of detectors, when activated, provides a multi-level voltage level indication on a state of the voltage being supplied by the power supply; and
wherein the IoT integrated circuit operates in a plurality of different modes, each such mode requiring a different voltage level from the power supply.

18. The Internet of Things integrated circuit of claim 17, wherein the IoT integrated circuit employs at least one low power wireless communication protocol for communication.

19. The Internet of Things integrated circuit of claim 17, wherein the controller is configured to:
control each of the plurality of detectors based on a crossing of a reference threshold voltage level of another detector of the plurality of detectors; and
wherein the control of a detector includes: enabling the detector and disabling the detector, wherein a disabled detector consumes no power.

* * * * *